(12) United States Patent
Fischer et al.

(10) Patent No.: US 6,600,761 B1
(45) Date of Patent: Jul. 29, 2003

(54) SEMICONDUCTOR LASER WITH MULTIPLE LASING WAVELENGTHS

(75) Inventors: Arthur J. Fischer, Albuquerque, NM (US); Kent D. Choquette, Urbana, IL (US); Weng W. Chow, Cedar Crest, NM (US)

(73) Assignee: Sandia Corporation, Albuquerque, NM (US)

( * ) Notice: Subject to any disclaimer, the term of this patent is extended or adjusted under 35 U.S.C. 154(b) by 168 days.

(21) Appl. No.: 09/847,178

(22) Filed: May 1, 2001

(51) Int. Cl.[7] .............................. H01S 5/00; H01S 3/10
(52) U.S. Cl. ........................................ 372/23; 372/50
(58) Field of Search .............................. 372/46, 50, 23, 372/45, 75, 97

(56) References Cited

U.S. PATENT DOCUMENTS 5,914,976 A * 6/1999 Jayaraman et al. ........... 372/50

* cited by examiner

*Primary Examiner*—Quyen Leung
(74) *Attorney, Agent, or Firm*—Brian W. Dodson

(57) ABSTRACT

A new class of multi-terminal vertical-cavity semiconductor laser components has been developed. These multi-terminal laser components can be switched, either electrically or optically, between distinct lasing wavelengths, or can be made to lase simultaneously at multiple wavelengths.

12 Claims, 1 Drawing Sheet

SEMICONDUCTOR LASER WITH MULTIPLE LASING WAVELENGTHS

GOVERNMENT RIGHTS

Figure 1:
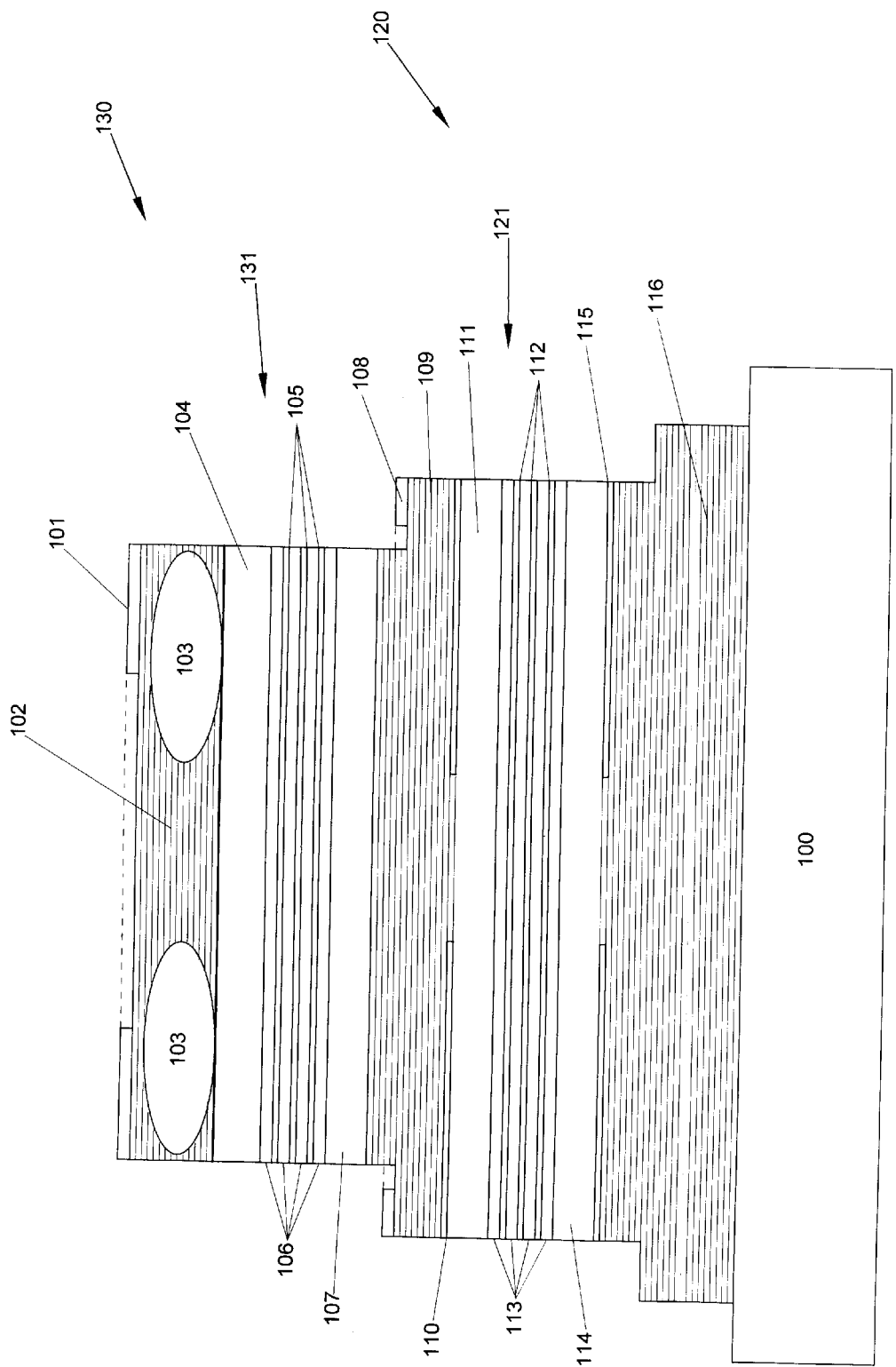

This invention was made with Government support under Contract DE-AC04-94AL85000 awarded by the U.S. Department of Energy. The Government has certain rights in the invention.

FIELD OF THE INVENTION

The present invention relates generally to semiconductor lasers, and more specifically to coupled resonator vertical-cavity lasers having multiple lasing wavelengths.

BACKGROUND OF THE INVENTION

A very useful component in a wide variety of laser and optical applications would be a compact, efficient, low-power laser able to emit laser radiation at a number of distinct wavelengths. The ability to switch from one lasing wavelength to another, triggered by an electrical and/or optical signal has one set of uses, while the ability to simultaneously lase at multiple wavelengths has another.

The ability to switch from one lasing wavelength to another has potential uses in optical switching, optical interconnection, wavelength-domain optical data transmission, spectroscopy, and other applications. Simultaneous lasing at multiple wavelengths appears to have special usefulness in spectroscopic applications, but also can have uses in many of the same areas for which switchable lasing wavelengths are useful.

There is therefore a long-felt need for a small, efficient, low power laser device which is capable of lasing at multiple wavelengths, either simultaneously, or which is capable of switching between the different lasing wavelengths.

Vertical-cavity surface emitting lasers (VCSELs) are small in size, and operate with reasonable efficiency and at quite low power. They are thus a reasonable candidate as the basis for a multiple wavelength laser which is small enough to enable the above applications, and also have the advantage that large numbers of VCSELs can be integrated into a single integrated circuit.

Conventional vertical-cavity surface emitting lasers (VCSELs) generally comprise a slab of active laser gain medium sandwiched between a pair of dielectric mirrors, these substructures being monolithically integrated on the surface of a semiconductor substrate. Such devices are usually lattice-matched or strained-layer structures, made of single-crystal direct-gap semiconductor materials. The most common materials used for construction are gallium arsenide based semiconductor alloys. VCSELs are commonly used to optically transfer information from one subsystem to another, either via free-space coupling or by coupling to a fiber optic.

SUMMARY OF THE INVENTION

A class of coupled-resonator vertical-cavity laser devices which are capable of lasing at multiple wavelengths has been invented. These lasers comprise vertically stacked multiple regions of electrically-pumped laser gain media, each such region being located in optically coupled resonators. Each region of laser gain media can be independently injected with current, resulting in an operating parameter space with distinct regions of optical behavior. These device's can be switched between different lasing wavelengths, or can be made capable of simultaneously lasing at multiple wavelengths.

BRIEF DESCRIPTION OF THE ILLUSTRATIONS

FIG. 1 shows a schematic cross-section of an implementation of the instant invention.

DETAILED DESCRIPTION

The instant invention is a class of semiconductor laser devices which are capable of lasing at one of a number of lasing wavelengths, or simultaneously at multiple lasing wavelengths. It is based upon VCSELs, but adds multiple resonant cavities with independently pumpable laser gain media. A device according to the instant invention has three or more electrical terminals, and functions in a much more complex manner than does the basic VCSEL.

Briefly, the instant invention is of a coupled-resonator vertical-cavity laser (CRVCL) which has multiple optically coupled cavities at least two of which contain active laser gain media. These active gain media can be independently excited, and variations of the excitation currents are associated with a number of operational functionalities.

The structure of a particular implementation of a coupled-resonator vertical-cavity laser capable of lasing at multiple wavelengths according to the instant invention is shown in FIG. 1. The drawing is not to scale. This implementation is described as being fabricated using the GaAs/AlGaAs compound semiconductor system, but the instant invention can be implemented in a variety of semiconductor systems. Efficient operation of such devices is aided if the semiconductor materials are single crystals. The lattice mismatch between the various materials used will usually be chosen to be sufficiently small that undue degradation of device operation from the presence or formation of dislocations and other defects does not occur.

A CRVCL according to the instant invention is fabricated on top of a GaAs substrate 100 which is doped to form a base electrical terminal which forms an electrical contacts to a base distributed Bragg reflector (DBR) 116, which is located atop substrate 100.

Base DBR 116 comprises alternating layers of at least two different semiconductor materials. The alternating layers, in this example being GaAs and AlGaAs, have optical thicknesses chosen so that base DBR 116 has optical reflectivity and transmissivity suitable for the desired operation of the device.

Additionally, in the example shown in FIG. 1, the alternating layers are doped to be electrically conducting so that an electrical input to base DBR 116 pass through to the remainder of the device. This function can also be served by vias to the substrate and other similar structures.

Laser cavity structure 120 is located on top of base DBR 116. Laser cavity structure 120 comprises laser cavity DBR 109 and active laser medium stratum 121, which is sandwiched between base DBR 116 and laser cavity DBR 109. In this example, laser cavity DBR 109 is electrically conducting, and is functionally attached to laser cavity electrical terminal 108.

In this example, active laser medium stratum 121 comprises multiple GaAs quantum wells 112 which are sandwiched between AlGaAs barrier layers 113. Active laser medium stratum 121 further comprises electrically conducting spacing layers 111 and 114, which cap the sandwich of barrier layers 113 and quantum wells 112.

In the example of FIG. 1, laser cavity structure 120 further comprises current concentration structure 110 and current concentration structure 116. Both these current concentration structures comprise an insulating layer with an aperture, the aperture positioned where the highest current concentration, and hence the maximum laser activity, is desired. The insulating layer can consist essentially of an oxidized semiconductor layer.

A second laser cavity structure 130 is located atop the first laser cavity structure 120. Laser cavity structure 130 comprises laser cavity DBR 102 and active laser medium stratum 131, which is sandwiched between laser cavity DBR 109 and laser cavity DBR 102.

In this example, laser cavity DBR 102 is electrically conducting, and is functionally attached to laser cavity electrical terminal 101. Laser cavity DBR 102 also comprises current concentration structure 103. Current concentration structure 103 comprises an annular region within laser cavity DBR 102, where the material in the annular region has been damaged by ion implantation so as to reduce the electrical conductivity of the annular region. Current passing from laser cavity electrical terminal 101 through laser cavity DBR 102 to the remainder of the device is thereby forced to primarily pass through the aperture within current concentration structure 103.

In this example, active laser medium stratum 131 comprises multiple GaAs quantum wells 105 which are sandwiched between AlGaAs barrier layers 106. Active laser medium stratum 131 further comprises electrically conducting spacing layers 104 and 107, which cap the sandwich of barrier layers 106 and quantum wells 105.

The thicknesses of laser cavity structures 120 and 130 are adjusted so that they are an integral number of their respective operating wavelengths in optical thickness. Note that the operating wavelength of laser cavity structures 120 and 130 need not be the same.

The coupling of the two laser cavity structures through laser cavity DBR 109 shifts the resonant modes of the device from those of the isolated laser cavity structures alone. When the isolated resonant modes have the same wavelength, the coupling between the cavities produces a splitting of the modes.

The resonant modes are split in wavelength by their coupling by an amount ranging from vanishingly small in the case where laser cavity DBR 109 is very thick (hence producing very little coupling), to a wavelength splitting of several percent when laser cavity DBR 109 is only a few pairs of layers in thickness, leading to very strong coupling between the resonators.

The CRVCL structure in FIG. 1 is configured as a three-terminal electrically driven device. Any of the electrical terminals (101, 108, or 100) can act as a source or drain for the other electrical terminals. This allows independent control of the current density in either of the active laser medium strata 121 and 131.

Applicants fabricated a CRVCL structure similar to that shown in FIG. 1. The structure was grown on a p-doped GaAs substrate. The base DBR was a p-type AlGaAs/GaAs distributed Bragg reflector with 35 periods of quarter-wave thickness layers. An AlGaAs layer was grown on top of the base DBR, and was selectively oxidized in an annular pattern so that the portion of the layer in the annulus became greatly reduced in electrical conductivity.

A first active laser medium stratum was grown on the proceeding structure. A first layer of p-type GaAs was grown on top of the selectively oxidized AlGaAs layer. This was followed by 6 AlGaAs barrier layers with 5 GaAs quantum wells with a thickness of 8 nanometers interleaved between them, and a layer of n-type GaAs. The total optical thickness of the p-type GaAs layer, the barrier layers, the quantum wells, and the n-type GaAs layer was one wavelength at the resonant wavelength of the laser cavity structure.

On top of the structure described above was grown another AlGaAs layer which is selectively oxidized in an annular pattern. On top of this was grown a n-type AlGaAs/GaAs laser cavity DBR with 11.5 periods. This amount of coupling produces a resonant mode splitting of about 1.4%.

A second active laser medium stratum was then grown on top of the proceeding structure, consisting essentially of a first layer of n-type GaAs was grown on top of the selectively oxidized AlGaAs layer. This was followed by 6 AlGaAs barrier layers with 5 GaAs quantum wells with a thickness of 8 nanometers interleaved between them, and a layer of p-type GaAs. The total optical thickness of the n-type GaAs layer, the barrier layers, the quantum wells, and the p-type GaAs layer was one wavelength at the resonant wavelength of the laser cavity structure.

Finally, a p-type AlGaAs/GaAs laser cavity DBR with 22 periods was grown on top of the proceeding structure. An annular region of the 22-period laser cavity DBR was implanted with protons to produce current confinement.

Following a two-tier etch, electrical terminals were formed on the topmost laser cavity DBR and on the middle laser cavity DBR. Electrical contact to the base DBR was made through the GaAs substrate.

The device described above is capable of dual wavelength lasing, where the wavelengths are those of the two laser cavity structures as altered by the intercavity coupling. The device can be operated with a constant excitation current applied to the upper cavity, and a variable current applied to the lower cavity.

In one particular demonstration, a constant 3.5 milliamp current was supplied to the upper cavity, and the current provided to the lower cavity was varied between 0 and 30 milliamps. The device initially lases at the shorter of the two cavity resonances at low current, with the laser wavelength rising from 864 nanometers to 867 nanometers as the lower cavity current is increased from 0 to about 12 milliamps.

When the lower cavity current is increased beyond 12 milliamps, but remains below about 28 milliamps, the device lases simultaneously at two wavelengths. These wavelengths are separated by roughly 10 nanometers, which is the coupling-induced resonance splitting for this structure. Again, the shorter of the laser wavelengths rises from 867 nanometers to 873 nanometers as the lower cavity current is increased from 12 milliamps to 28 milliamps.

When the lower cavity current is increased above 28 milliamps, the shorter of the laser wavelengths vanishes, and only the longer laser wavelength, at about 885 nanometers, persists.

This device can also be switched between the various regimes of lasing behavior by varying the upper cavity current while holding the lower cavity current constant.

Switching between the various regimes of lasing behavior appears to be controlled by several physical mechanisms, including saturable absorption and thermal rollover effects. The saturable absorption component of the switching process also enables optically-triggered switching between the various regimes of lasing behavior.

Description of the specific implementations above is not intended to limit the scope of the invention. The scope of the invention is intended to be set by the claims in view of the specification and the drawings.

What is claimed is:

1. A multiple-wavelength coupled-resonator vertical-cavity laser comprising:
   a) a base distributed Bragg reflector formed on a top surface of a substrate, comprising alternating layers of at least two electrically conducting single crystal semiconductor materials;
   b) a base electrical terminal functionally attached to the base distributed Bragg reflector; and,
   c) at least two laser cavity structures disposed in a vertical stack on the top surface of the substrate above the distributed Bragg reflector, each of said laser cavity structures having a resonance wavelength and comprising;
   1) an active laser medium stratum;
   2) a laser cavity distributed Bragg reflector positioned above the active laser medium stratum, such that the laser cavity distributed Bragg reflector comprises alternating layers of at least two electrically conducting single crystal semiconductor materials; and,
   3) a laser cavity electrical terminal functionally attached to the laser cavity distributed Bragg reflector.

2. The multiple-wavelength coupled-resonator vertical-cavity laser of claim 1, wherein at least one active laser medium stratum comprises at least one active quantum well.

3. The multiple-wavelength coupled-resonator vertical-cavity laser of claim 1, wherein each of the active laser medium strata comprises at least one active quantum well.

4. The multiple-wavelength coupled-resonator vertical-cavity laser of claim 1, wherein at least one active laser medium stratum comprises multiple active quantum wells.

5. The multiple-wavelength coupled-resonator vertical-cavity laser of claim 4, wherein the band structure of at least one of the active laser medium strata is altered by carrier tunneling between the multiple quantum wells within said active laser medium strata.

6. The multiple-wavelength coupled-resonator vertical-cavity laser of claim 1, wherein each of the active laser medium strata comprises multiple active quantum wells.

7. The multiple-wavelength coupled-resonator vertical-cavity laser of claim 6, wherein the band structure of each active laser medium stratum is altered by carrier tunneling between the multiple quantum wells within said active laser medium stratum.

8. The multiple-wavelength coupled-resonator vertical-cavity laser of claim 1, further comprising current concentration structures.

9. The multiple-wavelength coupled-resonator vertical-cavity laser of claim 8, wherein one of the current concentration structures comprises a disordered region within the uppermost laser cavity distributed Bragg reflector.

10. The multiple-wavelength coupled-resonator vertical-cavity laser of claim 8, wherein at least one of the current concentration structures is integrated with a laser cavity structure so that said laser cavity structure further comprises an insulating layer with an aperture, said insulating layer being positioned between the active laser medium stratum and the laser cavity distributed Bragg reflector.

11. The multiple-wavelength coupled-resonator vertical-cavity laser of claim 8, wherein at least one of the current concentration structures is integrated with a laser cavity structure so that said laser cavity structure further comprises an insulating layer with an aperture, said insulating layer being positioned beneath the active laser medium stratum.

12. An optoelectronic system comprising a multiple-wavelength coupled-resonator vertical-cavity laser according to claim 1.

* * * * *